United States Patent
Chang

(10) Patent No.: US 12,400,994 B2
(45) Date of Patent: Aug. 26, 2025

(54) SEMICONDUCTOR PLACING IN PACKAGING

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 810 days.

(21) Appl. No.: 17/586,781

(22) Filed: Jan. 28, 2022

(65) Prior Publication Data

US 2023/0137490 A1    May 4, 2023

Related U.S. Application Data

(60) Provisional application No. 63/274,924, filed on Nov. 2, 2021.

(51) Int. Cl.
   *H01L 23/00* (2006.01)

(52) U.S. Cl.
   CPC .... *H01L 24/80* (2013.01); *H01L 2224/80125* (2013.01); *H01L 2224/80986* (2013.01)

(58) Field of Classification Search
   None
   See application file for complete search history.

(56) References Cited

U.S. PATENT DOCUMENTS

| | | | |
|---|---|---|---|
| 7,146,718 B2* | 12/2006 | Thuerlemann | H01L 21/67144 414/744.8 |
| 11,255,529 B1* | 2/2022 | Wu | H01L 24/02 |
| 2014/0311652 A1* | 10/2014 | Kostner | H01L 24/75 156/60 |
| 2023/0392921 A1* | 12/2023 | Yoshida | H01L 24/75 |

* cited by examiner

*Primary Examiner* — Michelle Mandala
(74) *Attorney, Agent, or Firm* — KILPATRICK TOWNSEND & STOCKTON LLP

(57) ABSTRACT

A method for placing a semiconductor onto a substrate is provided. The method includes the following steps: transferring, using a placement tool, the semiconductor along a path over onto the substrate; lowering, using the placement tool, the semiconductor to a predetermined height above the substrate; titling, using the placement tool, the semiconductor, to a predetermined angle; determining, using the placement tool, a first contact point of the semiconductor to the substrate at the predetermined angle; determining, using the placement tool, the first contact point is shift-off from an alignment position on the semiconductor with respect to the substrate; adjusting, using the placement tool, the first contact point to correct the shift-off; and lowering, using the placement tool, the semiconductor to make a first contact with the substrate at the corrected first contact point.

20 Claims, 10 Drawing Sheets

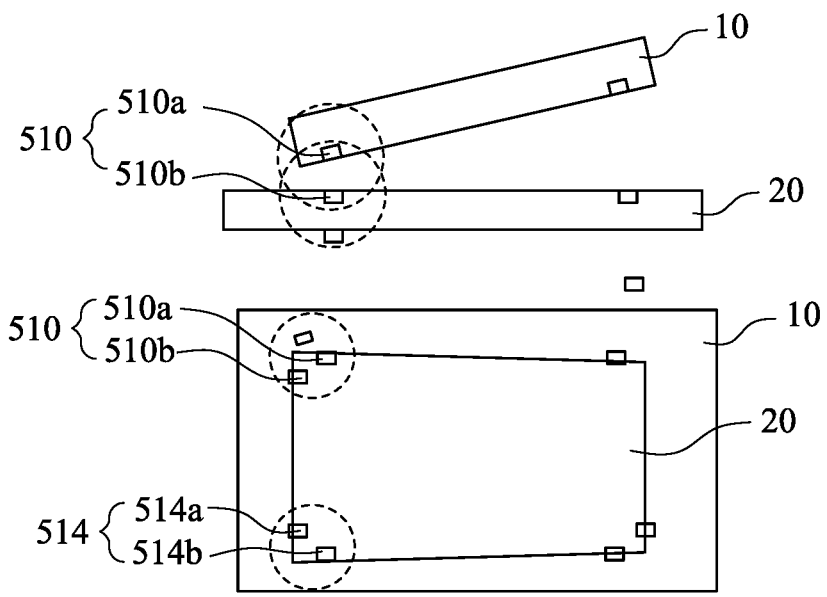
Fig. 5B
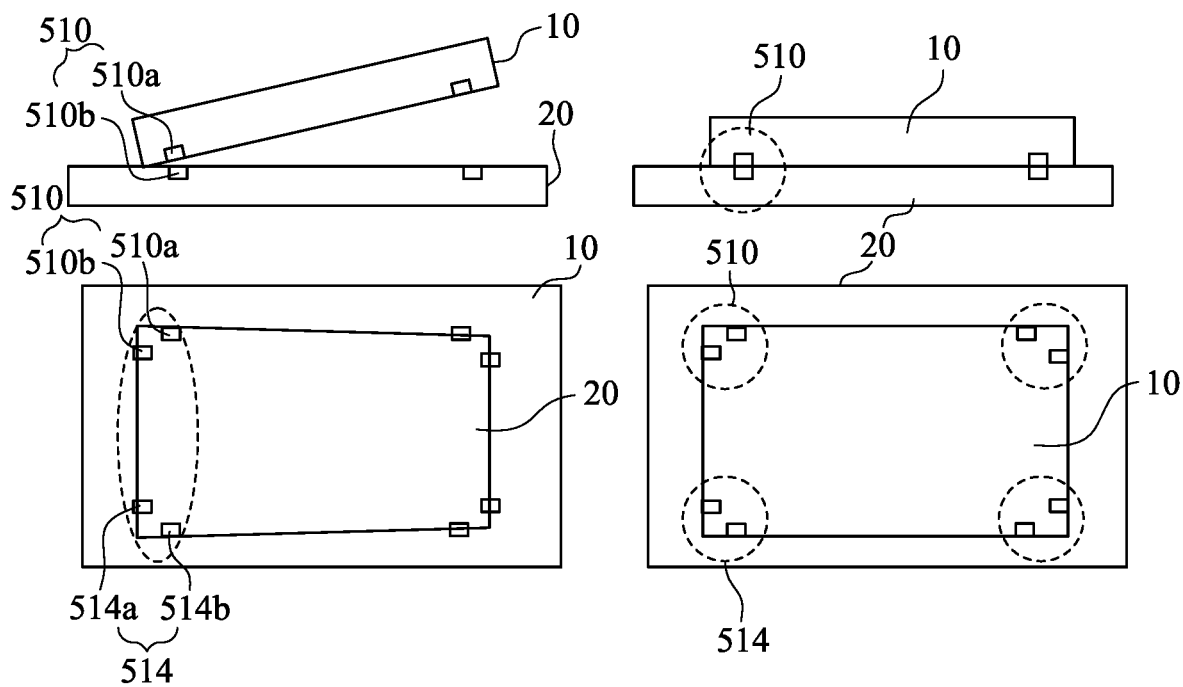
Fig. 5C
Fig. 5D

SEMICONDUCTOR PLACING IN PACKAGING

CROSS-REFERENCES TO RELATED APPLICATIONS

The present application claims priority to U.S. Provisional Patent Application No. 63/274,924, filed on Nov. 2, 2021, the entire disclosure of which is incorporated herein by reference.

TECHNICAL FIELD

The present disclosure relates to hybrid bonding, and more particularly to metal layer structures for reducing dishing and erosion effects.

BACKGROUND

The manufacturing of integrated circuits often involves the bonding of device dies to package substrates. In a typical bonding process, a device die is first picked up from a wafer that has already been sawed into dies. The device die is placed on a table. A pick and place tool then picks up the device die from the table, and then places the device die on a package substrate. After a plurality of devices dies are placed on a plurality of package substrate, the package substrate strip along with the device dies go through a reflow process, so that the device dies are bonded to the package substrates.

BRIEF DESCRIPTION OF THE DRAWINGS

The present disclosure is best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5D illustrate one example of placing a semiconductor using a placement tool in accordance with the disclosure.

DETAILED DESCRIPTION

Figure 1A:
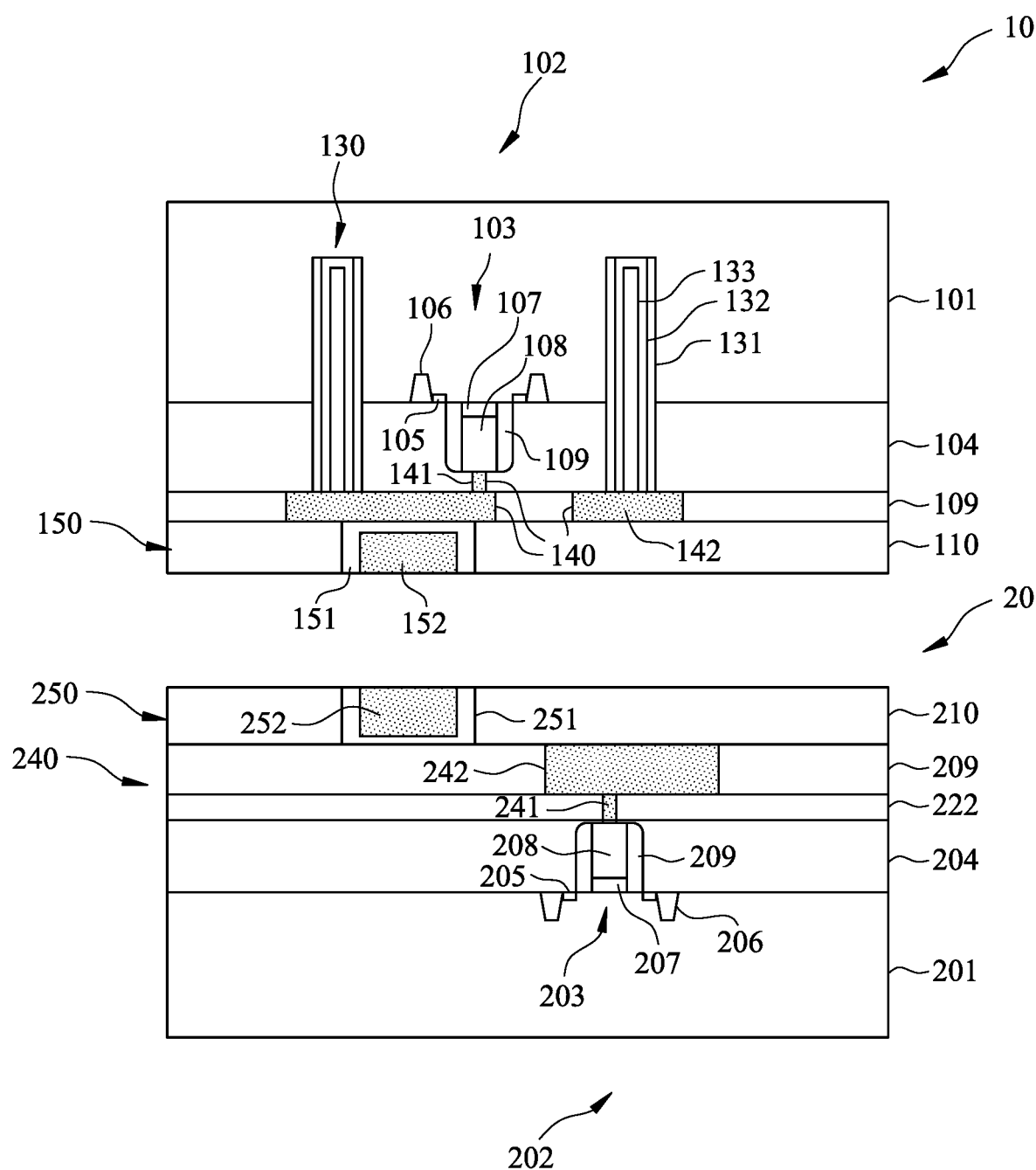
FIGS. 1A-1B are cross-sectional views illustrating various stages of forming an example semiconductor device of interest to the present disclosure.

The following disclosure provides many different embodiments or examples for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Prepositions, such as "on" and "side" (as in "sidewall") are defined with respect, to the conventional plane or surface being on the top surface of the wafer or substrate, regardless of the orientation of the wafer or substrate. The term "horizontal" is defined as a plane parallel to the conventional plane or surface of a water or substrate, regardless of the orientation of the wafer or substrate. The term "vertical" refers to a direction perpendicular to the horizontal as defined above, i.e., perpendicular to the surface of a substrate. The terms "first," "second," "third," and "fourth" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

There are many packaging technologies to house the semiconductors such as the 2D fan-out (chip-first) IC integration, 2D flip chip IC integration, PoP (package-on-package), SiP (system-in-package) or heterogeneous integration, 2D fan-out (chip-last) IC integration, 2.1D flip chip IC integration, 2.1D flip chip IC integration with bridges, 2.1D fan-out IC integration with bridges, 2.3D fan-out (chip-first) IC integration, 2.3D flip chip IC integration, 2.3D fan-out (chip-last) IC integration, 2.5D (solder bump) IC integration, 2.5D (μbump) IC integration, μbump 3D IC integration, μbump chiplets 3D IC integration, bumpless 3D IC integration, bumpless chiplets 3D IC integration, SoIC and/or any other packaging technologies. It should be understood various embodiments disclosed herein although are described and illustrated in a context of a specific semiconductor packaging technology, it is not intended to limit the present disclosure only to that packaging technology. One skilled in the art would understand those embodiments may be applied in other semiconductor technologies in accordance with principles, concepts, motivations, and/or insights provided by the present disclosure.

System on integrated chip (SoIC) is a recent development in advanced packaging technologies. SoIC technology integrates both homogeneous and heterogeneous chiplets into a single System-on-Chip (SoC)—like chip with a smaller footprint and thinner profile, which can be holistically integrated into advanced WLSI (aka CoWoS® service and InFO). From external appearance, the newly integrated chip is just like a general SoC chip yet embedded with desired and heterogeneously integrated functionalities. SoIC realizes 3D chiplets integration with additional advantages in performance, power and form factor. Among many other features, the SoIC features ultra-high-density-vertical-stacking for high performance, low power, and min RLC (resistance-inductance-capacitance). SoIC integrates active and passive chips into a new integrated-SoC system to achieve better form factor and performance. US Patent Publication #20200168527, entitled "SoIC chip architecture" provides some descriptions about some example SoIC structures. US Patent Publication #20200168527 is incorporated by reference in its entirety. Another example of SoIC can be found at https://3dfabric.tsmc.com/english/dedicatedFoundry/technology/SoIC.htm, which is also incorporated by reference in the present disclosure in its entirety.

Numerous benefits and advantages are achieved by way of the present disclosure over conventional techniques. For example, embodiments provide an improved placement tool for semiconductor packaging such as chip on wafer (CoW), wafer on wafer (WoW), and/or any other bonded structure. In various embodiments, the placement tool in accordance with the present disclosure includes a head configured to be tilt-able. For placing an individual die on a wafer, the head is tilted to form an angle with respect to an upper surface of the wafer. Before placing the die onto the wafer, the placement tool in accordance with the present disclosure is configured to tilt the head and detect a contact point of the die with the upper surface of the wafer, The placement tool in accordance with the present disclosure is configured to determine whether the contact point is align with a position on the wafer where the die is supposed to be placed. If the placement tool determines a misalignment exists, it is configured to adjust a position of the head to align the die to the position on the wafer where the die is supposed to be placed. Once determining that the die is aligned, the placement tool in accordance with the present disclosure is configured to lay down the die onto the wafer at the contact first and determine whether the die is laid at the contact. Once determining the die has made the contact with the wafer, the placement tool in accordance with the present disclosure is configured to lay down the rest of the die onto the wafer. In this way, precision of placing individual dies onto wafer is improved. These and other embodiments of the disclosure, along with many of its advantages and features, are described in more detail in conjunction with the text below and corresponding figures.

Example Semiconductor Device

Figure 1B:
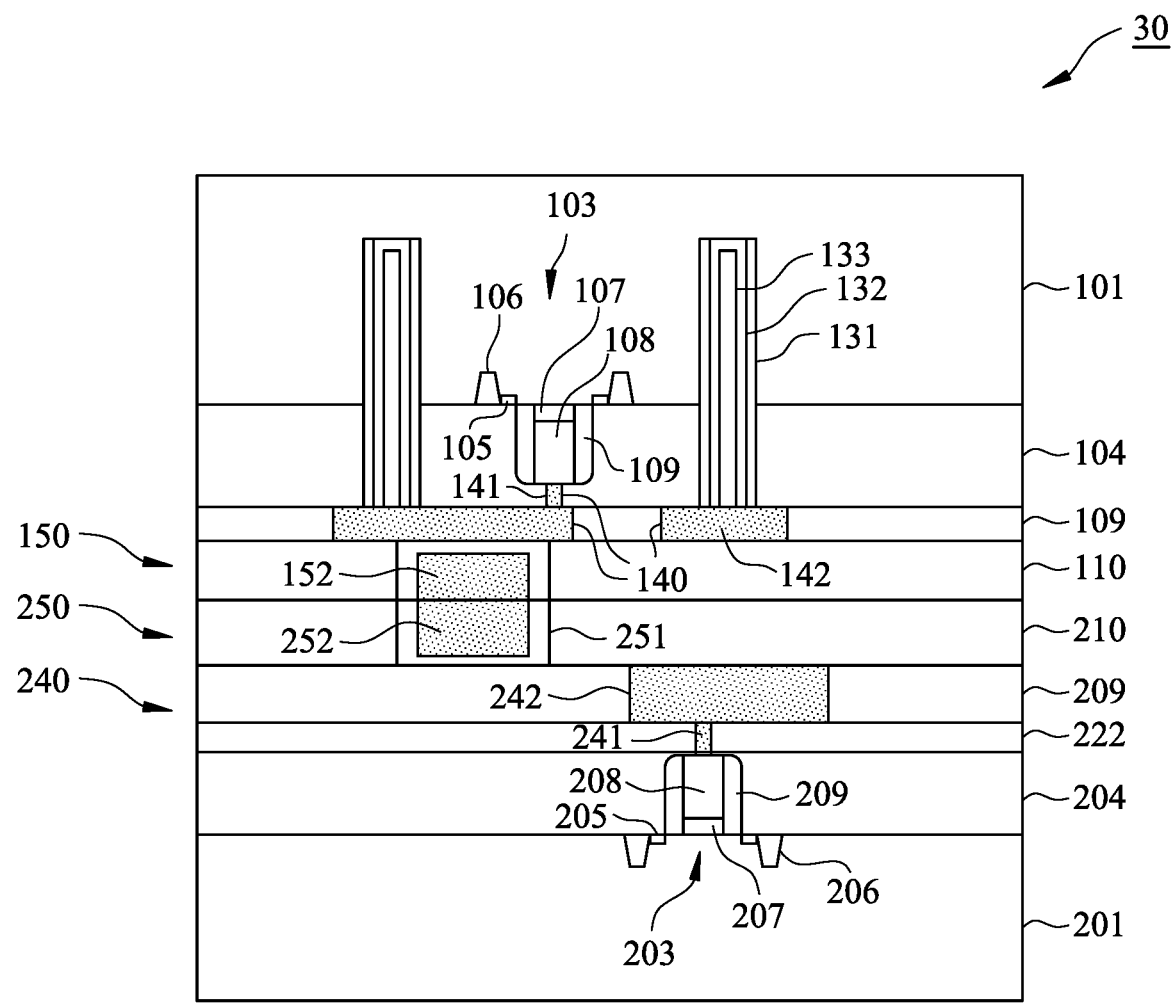

FIGS. 1A and 1B are cross-sectional views illustrating various stages of forming an example semiconductor device of interest to the present disclosure. FIG. 1A shows a cross-sectional view of a portion of a first semiconductor 10 and a portion of a semiconductor wafer 20 according to an embodiment. The first semiconductor 10 includes a substrate 101, and the second semiconductor wafer 20 includes a substrate 201. In an embodiment, each of the substrates 101 and 201 may include silicon or other semiconductor materials. In another embodiment, each the substrates 101 and 201 may include other elementary semiconductor materials, such as germanium. In some embodiments, each the substrates 101 and 201 may include a compound semiconductor, such as silicon carbide, gallium arsenic, indium arsenide, or indium phosphide. In some other embodiments, each the substrates 101 and 201 may include an alloy semiconductor, such as silicon germanium, silicon germanium carbide, gallium arsenic phosphide, or gallium indium phosphide. In some embodiments, the substrate 101 and/or substrate 201 may include an epitaxial layer, e.g., the substrate 101 and/or substrate 201 includes an epitaxial layer overlying a bulk semiconductor.

As shown, the first semiconductor 10 includes a device region 102 formed on the substrate 101. The device region 102 includes a gate structure 103 embedded in a dielectric layer 104, source/drain regions 105, and isolation (e.g., shallow trench isolation) structures 106. The gate structure 103 includes a gate dielectric layer 107, a gate electrode 108, and possibly insulating materials 109. The device region 102 shown in FIG. 1A is merely for illustration only and not limiting. Other structures may be formed in the device region 102. Other transistors (e.g., FinFETs, NMOS, PMOS transistors) and devices (capacitors, resistors, diodes, inductors, and the like) may also be formed on the substrate 101.

Referring still to FIG. 1A, the dielectric layer 104 is disposed on the substrate 101 and covering the device region 102. The first semiconductor 10 also includes a plurality of through-substrate vias (TSVs) 130 in the dielectric layer 104 and extending into the substrate 101. The TSVs 130 are configured to provide electrical connection to the second semiconductor wafer 20. It is noted that two TSVs are shown for illustration only, the number of TSVs can be any integer number according to actual applications.

In an embodiment, each TSV can include a liner 131, a diffusion barrier layer 132, and a conductive material 133. The liner 131 may include an insulating material, e.g., oxides or nitrides and may be formed by a plasma enhanced chemical vapor deposition (PECVD) process or other deposition processes. The liner 131 may be a single layer or multi-layers. The diffusion barrier layer 132 may include Ta, TaN, Ti, TiN, CoW, or a combination thereof. In an embodiment, the diffusion barrier layer 132 is formed by a physical vapor deposition (PVD) process. The conductive material 133 may include copper (Cu), copper alloy, aluminum (Al), aluminum alloys, or combinations thereof. Alternatively, other applicable materials may also be used. In an embodiment, the conductive material 133 is formed by plating.

The first semiconductor 10 further includes a metallization structure 140 on the TSV 130 and the device region 102 to connect the TSV 130 to the device region 102. In an embodiment, the metallization structure 140 includes an interconnect structure, such as contact plugs 141 and conductive features 142. The conductive features 142 are embedded in an insulating material 109. In some embodiments, the insulating material 109 includes multiple layers of a dielectric material, such as an oxide, e.g., silicon oxide, the contact plugs 141 include copper, aluminum, tungsten, combinations thereof, or the like, and the conductive features 142 include a metallic material, such as copper, copper alloy, aluminum, aluminum alloy, or combinations thereof.

The first semiconductor 10 further includes a bonding structure 150 on the metallization structure 140. In some embodiments, the bonding structure 150 includes a barrier layer 151 and a conductive material 152. The barrier layer 151 and the conductive material 152 are embedded in a bonding layer 110 disposed on the insulating material 109. In some embodiments, the bonding layer 110 includes an oxide or polymer material. The conductive material 152 includes a metallic material, such as copper, copper alloy, aluminum, aluminum alloy, or combinations thereof. When the conductive material 152 includes copper, which can diffuse into the insulating material 109, the barrier layer 151 is formed between the conductive material 152 and the insulating material 109. The barrier layer 151 may include silicon nitride (SiN), silicon oxynitride (SiON), titanium nitride (TiN), tantalum nitride (TaN), aluminum nitride (AlN), TaN, Ta/TaN, CoP, CoW, or the like. In some embodiments, the bonding layer 110 includes a polymer material, such as benzocyclobutene (BCB) polymer, polyimide (PI), or polybenzoazole (PBO). In some embodiments, the polymer material is deposited over the substrate by spin coating.

The second semiconductor wafer 20 includes a device region 202 on the substrate 201. The device region is formed in the second semiconductor wafer 20 in a front-end-of-line (FEOL) process. In some embodiments, the device region includes a gate structure 203 embedded in a dielectric layer 204, source/drain regions 205, and isolation structures 206. The gate structure 203 includes a gate dielectric layer 207, a gate electrode 208, and spacers 209. It is noted that the gate structure 203 is merely an example, and other structures may be formed in the gate structure 203. In some embodiment, the gate structure 203 may include various N-type metal oxide semiconductor (NMOS) and/or P-type metal oxide semiconductor (PMOS) devices, fin-type field-effect transistors (FinFETs), gate-all-around (GAA) devices, memories, and the like. Other devices, such as capacitors, diodes, resistors, photo-diodes, and the like can also be formed on the substrate 201.

The second semiconductor wafer 20 further includes a metallization structure 240 and a bonding structure 250. The metallization structure 240 includes contact plugs 241 embedded in a dielectric layer 222 and conductive features 242 embedded in an insulating material 209. The bonding structure 250 is similar to the bonding structure 150 and includes a barrier layer 251 and a conductive material 252 embedded in a polymer material 210, such as benzocyclobutene (BCB) polymer, polyimide (PI), or polybenzoazole (PBO). The barrier layer 251 is similar to the barrier layer 151 and may include silicon nitride (SiN), silicon oxynitride (SiON), titanium nitride (TiN), tantalum nitride (TaN), aluminum nitride (AlN), TaN, Ta/TaN, CoP, CoW, or the like The conductive material 252 is similar to the conductive material 152 and includes a metallic material, such as copper, copper alloy, aluminum, aluminum alloy, or combinations thereof. A polishing, e.g., a chemical mechanical polishing (CMP), process is performed on the surface of the bonding layers 110, 210, of the first and second semiconductor wafers 10 and 20, respectively.

FIG. 1B shows a cross-sectional view of the first semiconductor 10 and a portion of the second semiconductor wafer 20 of FIG. 1A after an alignment between the two and a bonding of the two are performed according to an embodiment. In an embodiment, the first semiconductor 10 and the second semiconductor wafer 20 are hybrid bonded together by applying pressure and heat to form a stacked structure 30. In an exemplary embodiment, the hybrid bonding is performed at a temperature in a range between about 100° C. and 200° C., so that the polymer materials 110 and 210 become a non-confined viscous liquid and are reflowed. Thereafter, the stacked structure 30 is further heated to a higher temperature in a range between about 200° C. and about 400° C., so that the conductive materials 152 and 252 are interconnected by thermal compression bonding and polymer materials 110 and 220 are fully cured. In some embodiments, the pressure for hybrid bonding is in a range between about 0.7 bar to about 10 bar. The hybrid bonding process may be performed in an inert environment, e.g., with an inert gas including $N_2$, Ar, He, or combinations thereof.

Hybrid bonding involves at least two types of bonding, such as metal-to-metal bonding and non-metal-to-non-metal bonding. During a CMP process, corrosion of a copper or copper alloy layer or copper dishing may occur, i.e., a portion of the conductive material 152 and portion of the conductive material 252 may be removed causing a decrease in the electrical interconnection between the first and second conductor wafers 10 and 20.

Die Placement

Figure 2A:
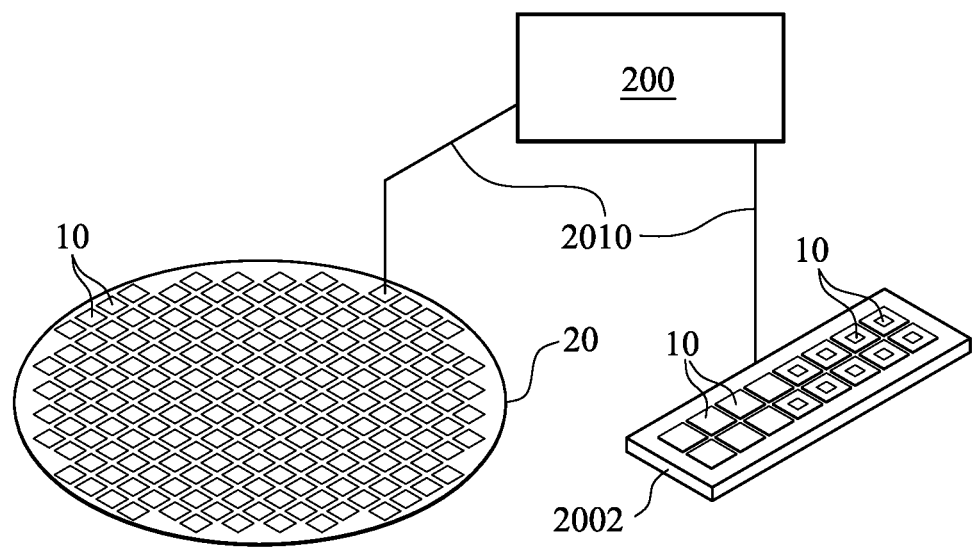
FIGS. 2A-2B illustrate a placement tool for packing the semiconductor device shown in FIG. 1 according to an embodiment.
Figure 2B:
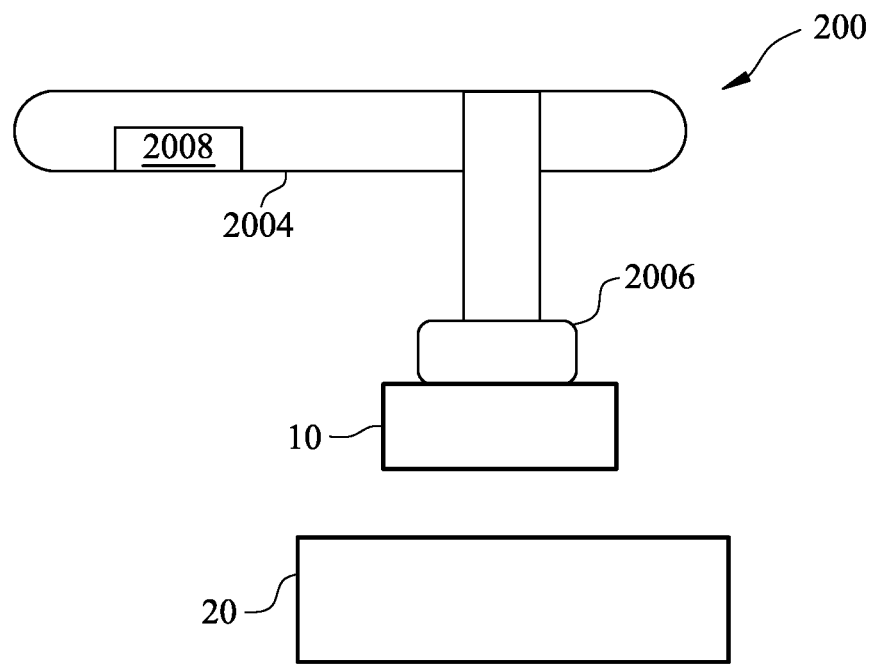

Attention is now directed to FIGS. 2A-B, where a placement tool 200 is shown to place individual semiconductor 10 onto a semiconductor wafer 20 shown in FIGS. 1A-B is illustrated. It will be described with reference to FIGS. 1A-B. As shown in FIG. 2A, the placement tool 200 is configured to transfer individual semiconductor 10 from a substrate strip 202 to semiconductor wafer 20. In various implement, the placement tool 200 includes a head, a stepper motor, a controller, and/or any other components. In those implementation, the controller typically operates under the control of an operating system and executes or otherwise relies upon various computer software applications, components, programs, objects, modules, engines, data structures. In general, the controller may be configured to control the operation of the head of the placement tool 200 when its instructions are executed by the processor, in order to pick up individual semiconductors 10 and transfer individual semiconductor 10 from the substrate 202.

As shown in FIG. 2B, in accordance with the present disclosure, the placement tool 200 includes a robotic arm 204 and a pick-up head 206. The pick-up head 206 is equipped with an acquisition device, such as pneumatic suction cups, capable of temporarily and releasably holding the semiconductor 10. The robotic arm 204 is configured to move the pick-up head 206 over a motion path 210 shown in FIG. 2A. The motion path 210 may originate at the substrate strip 202 where an individual semiconductor 10 is picked by the pick-up head 206 and terminate at a location on the semiconductor wafer 20. The motion of the pick-up head 206 may be unbroken and continuous over the motion path 210.

The robotic arm 204 may be a programmable mechanical arm with links connected by joints allowing rotational motion and/or translational displacement of the pick-up head 206. The robotic arm 204 may be, for example, a three-axis R-Theta robot arm or a selectively compliant articulated robot arm (SCARA). The robotic arm 204 is configured to manipulate and accurately position the pick-up head 206 and to move the pick-up head 206. In some implementation, as shown here, the movement of the robotic arm is controlled by a stepper motor 208 of the placement tool 200 shown.

Figure 3:
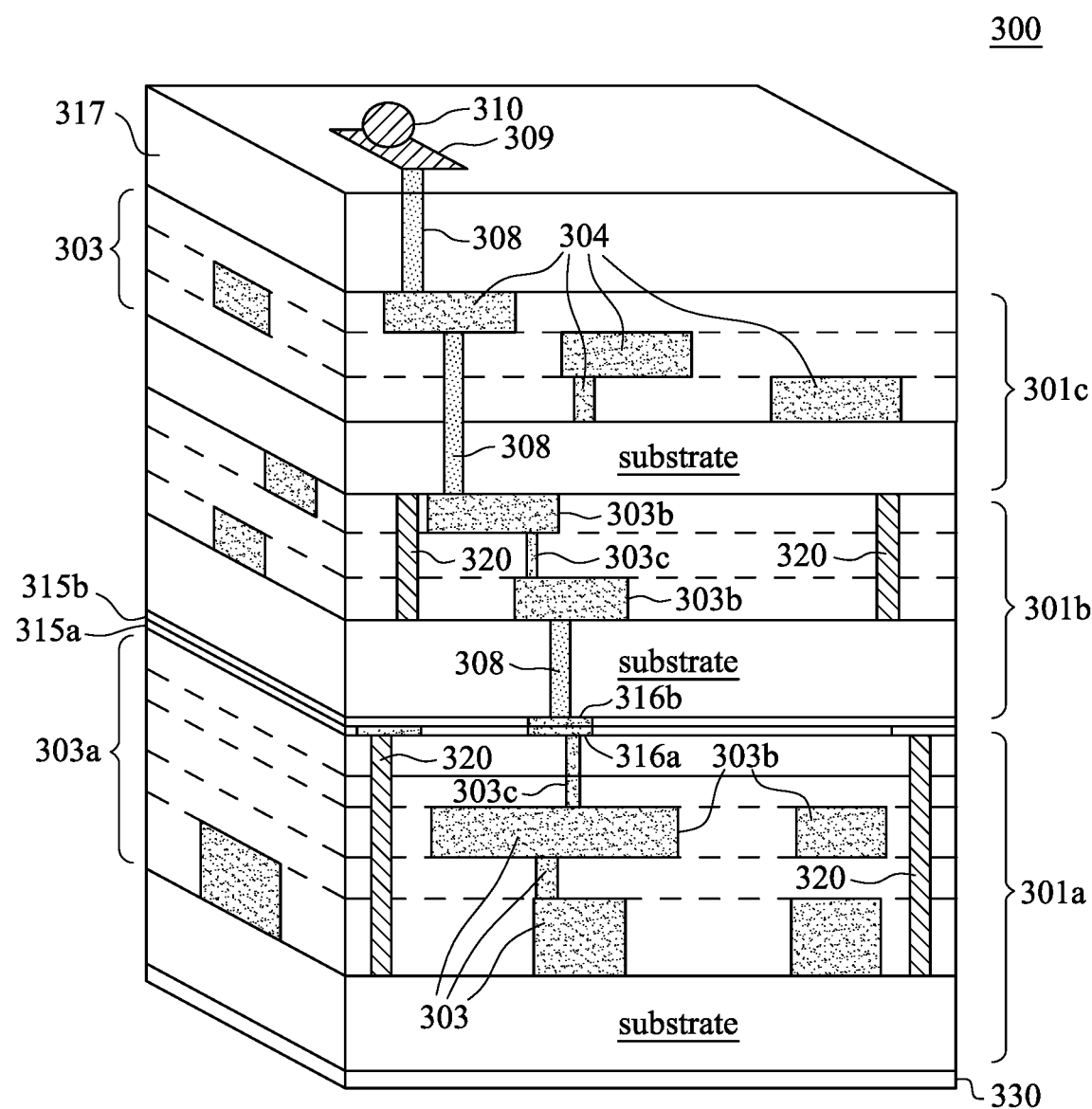
FIG. 3 illustrates one example of two layers of semiconductors are placed on a wafer in accordance with the present disclosure.

In various implementation, the semiconductors 10 are formed by processing a wafer with front-end-of-line processes. The individual semiconductor 10 may be separated from the wafer by mechanical sawing, by scribing and breaking, by laser cutting, or by a different technique. It should be understood that multiple layers of semiconductors 10 may be stacked on the semiconductor wafer 20 in accordance with the present disclosure. That is, the present disclosure is not limited to only one layer of semiconductors 10 being placed on the semiconductor wafer 20. FIG. 3 illustrates one example of two layers of semiconductors are placed on a wafer in accordance with the present disclosure.

Referring to FIG. 3, in this example, a multi-die structure 300 is formed, which includes a first die 301*c*, and a second die 301*b*, stacked on top of a portion of wafer 301*a*. Each of the first, second dies 301c and 301b may include a substrate, an active region including a plurality of active devices (not shown), an interconnect structure 303 formed on the substrate and configured to electrically connect the active region of each die with each other. The interconnect structure 303 may include a plurality of dielectric layers 303a, metal lines 303b formed in the dielectric layers 303a, and vias 303c connecting metal lines 303b in different layers. In some embodiments, the dielectric layers 303a include silicon oxide, silicon nitride, silicon carbide, silicon oxynitride, and/or combinations thereof. In some embodiments, the dielectric layers 303a may include one or more low-k dielectric layers having low k values. In some embodiments, the k values of the low-k dielectric materials may be lower than about 3.0.

In some embodiments, the dies 301c and 301b, and the wafer 301a are electrically coupled to each other by through substrate vias (TSVs) and through oxide vias (TOVs) 308. In some embodiments, the die group 30 also includes a bonding layer 317 including an oxide material, e.g., silicon oxide. In some embodiments, the bonding layer 317 may include a plurality of bonding films and electrical connectors 309 having a plurality of solder regions. In some embodiments, the electrical connectors 309 include copper posts, solder caps, and/or electrically conductive bumps 310 configured to electrically coupled to other electronic circuits on a printed circuit board or other substrates. In an embodiment, the stacked dies of the multi-die structure 30 include logic devices, input/output (10) devices, processing units, e.g., data processing units, graphics processing unit, application specific integrated circuits (ASIC), field programmable gate arrays (FPGA), other applicable types of devices. In some embodiment, the multi-die structure 300 is a system-on-integrated circuits (SoIC) device that includes multiple functions. It is understood that the number of dies in the multi-die structure 300 is illustrative only and is chosen for describing the example embodiment and should not be limiting. For example, the d multi-die structure 300 can include a single die, two dies, or more than three dies. In some embodiments, the multi-die structure 300 may be bonded to a package substrate (e.g., an interposer, a printed circuit board) through flip-chip bonding using the electrical connectors 309.

In some embodiments, the dies and wafer 301a-c are bonded to each other by a hybrid bonding process. In an embodiment, the wafer 301a has a first bonding surface formed on its upper surface including a first bonding dielectric layer 315a and a first conductive contact structure 316a. The second die 301b has a second bonding surface formed on a bottom of its substrate, the second bonding surface includes a second bonding dielectric layer 315b and a conductive contact structure 316b. In an embodiment, the first and second conductive contact structures 316a, 316b may be electrically coupled to the interconnect structure 303. In another embodiment, the first and second conductive contact structures 316a, 316b may not be electrically coupled to the interconnect structure 303. In an embodiment, the wafer 301a and the second die 301b are directly hybrid bonded together, such that the first and second conductive contact structures 316a, 316b are bonded together, and the first and second bonding dielectric layers 315a, 315b are bonded together. In an embodiment, the first and second bonding dielectric layers 315a, 315b each include silicon oxide, and the first and second conductive contact structures 316a, 316b each include copper.

In an embodiment, the dies also include a seal ring 320 configured to stop cracks generated by stress during the bonding processes and/or the singulation. The seal ring 320 is also configured to prevent water, moisture, and other pollutant from entering the dies. In an embodiment, the seal ring 320 includes copper configured to suppress electromagnetic noise. In an embodiment, the first die 301a may include a bonding dielectric layer 330 configured to be bonded to a carrier substrate by fusion bonding.

Alignment

Figure 4:
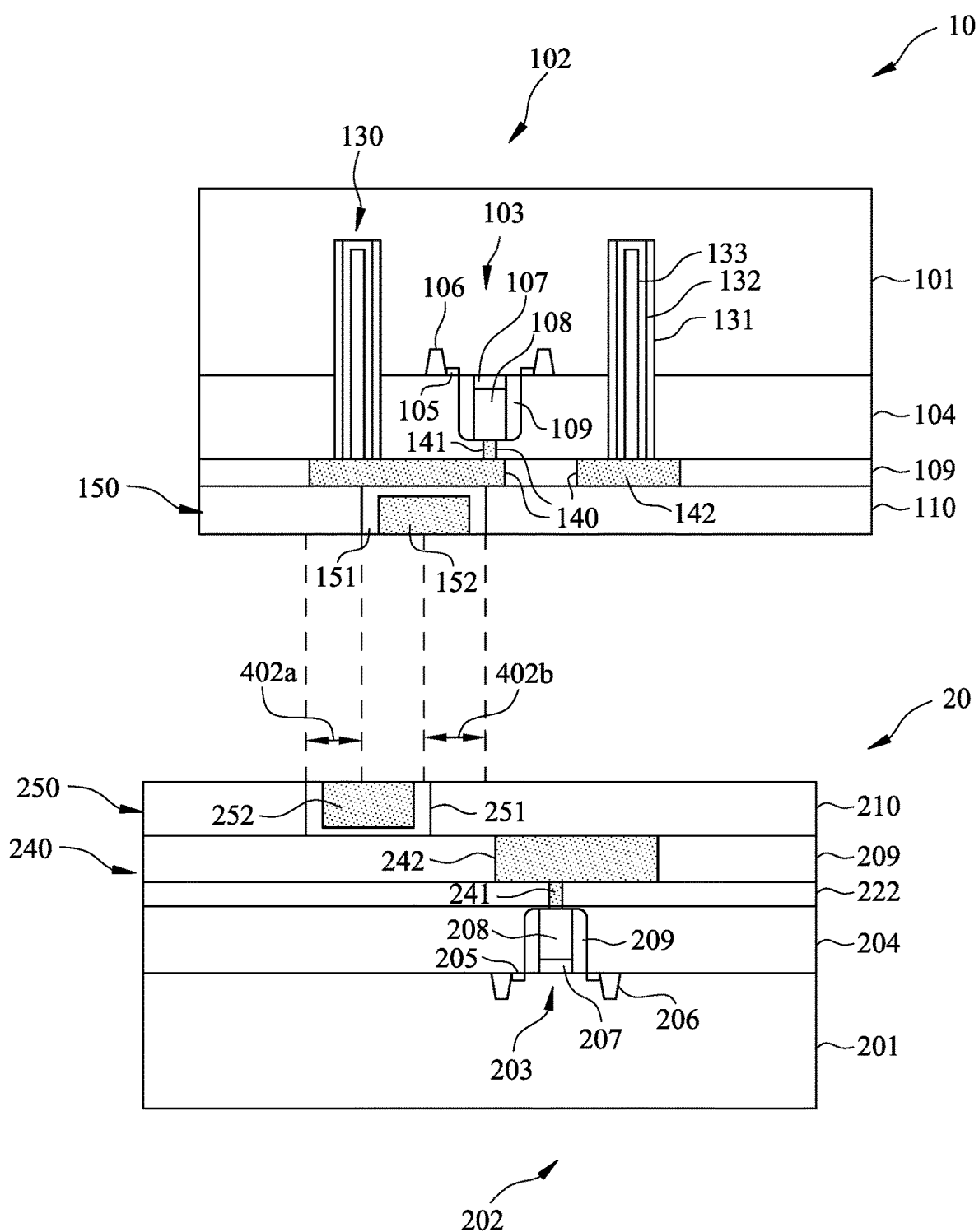
FIG. 4 illustrates an observed misalignment of semiconductor and semiconductor wafer by a placement tool.

As can be seen, for forming a multi-die structure 300 or a bonded structure 30 shown in FIGS. 1 and 3, individual semiconductors should be placed onto wafer at locations where the conductive regions are aligned, and the dielectric/insulation regions are aligned. However, it is observed that prior art placement tool is not configured to control the placement of semiconductors onto wafer, such as semiconductors 10 onto semiconductor wafer 20 shown in FIG. 2A, with a precision appropriate for miniaturized scale such as 1 nm. FIG. 4 illustrates an observed misalignment of semiconductor 10 and semiconductor wafer 20 by a prior art placement tool.

FIG. 4 illustrates when placing individual semiconductor 10 onto wafer 20 illustrated in FIG. 2A, a shift 404a and 402b can take place causing the semiconductor 10 not aligned with the semiconductor wafer 20. It is observed that such a shift error may be due to a precision of the placement tool 200 is limited and may not satisfy a placement of the semiconductor 10 onto the semiconductor wafer 20. For example, it is observed that the shift error 404a and 404b are between 0.5 to 1 um, which can cause the conductive regions 152 and 252 are not aligned to affect a performance with the bonded structure 30.

Improved Placement

For addressing the above-mentioned misalignment when placing individual semiconductors onto a wafer, improvements over the placement tool are made. In some embodiments, the placement tool in accordance with the present disclosure is configured to tilt the pick-up head to form an angle before the semiconductor is placed onto the wafer. In some embodiments, before lowering the semiconductor to the wafer to make a contact, a location of the contact is first detected by the placement tool in accordance with the present disclosure. Based on the detect location, the placement tool in accordance with the present disclosure determines whether the location of the contact is where the semiconductor is supposed to be placed on the wafer such that it is aligned as shown in FIG. 1B. In those embodiments, if the placement tool determines that a misalignment exists, it is configured to move accordingly to correct the misalignment. This cycle can continue until the placement tool 200 determines that semiconductor 10 is aligned with the wafer 20. In some embodiments, the placement tool in accordance with the present disclosure is configured to lay the semiconductor first at the location of the contact and to determine if the contact has been made. In those embodiments, after determining the contact has been made, the placement tool is configured to lay the rest of semiconductor onto the wafer.

FIG. 5 illustrates one example of a placement tool in accordance with the disclosure. As can be seen, the placement tool 500 in this example includes a robotic arm 504, a pick-up head 506, a stepper motor 508, and/or any other components. As shown, the pick-up heard 506 is tilt-able such that the semiconductor 10 can be tilted by the placement tool 500 to form an angle 502 with respect to an surface of the wafer 20. It should be understood although wafer 20 is shown in this example, this is not intended to be limiting. As mentioned above, in various embodiments, the placement tool 500 is used to place semiconductor 10 onto another semiconductor, which may be already placed on the wafer 20, or may be placed on another semiconductor that is directly or indirectly placed on the wafer 20.

As can be seen, because the pick-up head 506 is tilted, the semiconductor 10 is also tilted such that a portion of the semiconductor 10 is going to first touch the wafer 20 at a contact point 510a on the semiconductor 10 before the rest of the semiconductor 10. As shown, if lowered by the pick-up head 206, the semiconductor 10 will make a contact with wafer 20 at contact point 510b on wafer 20. In implementation, at a predetermined height 520, the pick-up head 506 is configured to tilt. As shown, the stepper motor 508 of the placement tool 500 in accordance with the present disclosure can be configured to emit one or more optical beams 512 to detect a location of the contact point 510a and/or 510b. Because the predetermined height and the angle 502 are known, and because the detected contact location(s) can be known from the optical beam(s), the placement tool 500 is configured to determine the location of the contact 510 when the semiconductor 10 is placed on the wafer 20. If the determined location of the contact 510 is off from the align structures on the wafer 20 as shown in FIG. 4, the placement tool 500 is configured to correct the pick-up head by the shift error 402a and/or 402b shown in FIG. 4. This contact point detection and determination can continue until the placement tool 500 determines that the contact 510 is aligned with corresponding structure on wafer 200.

Figure 5A:
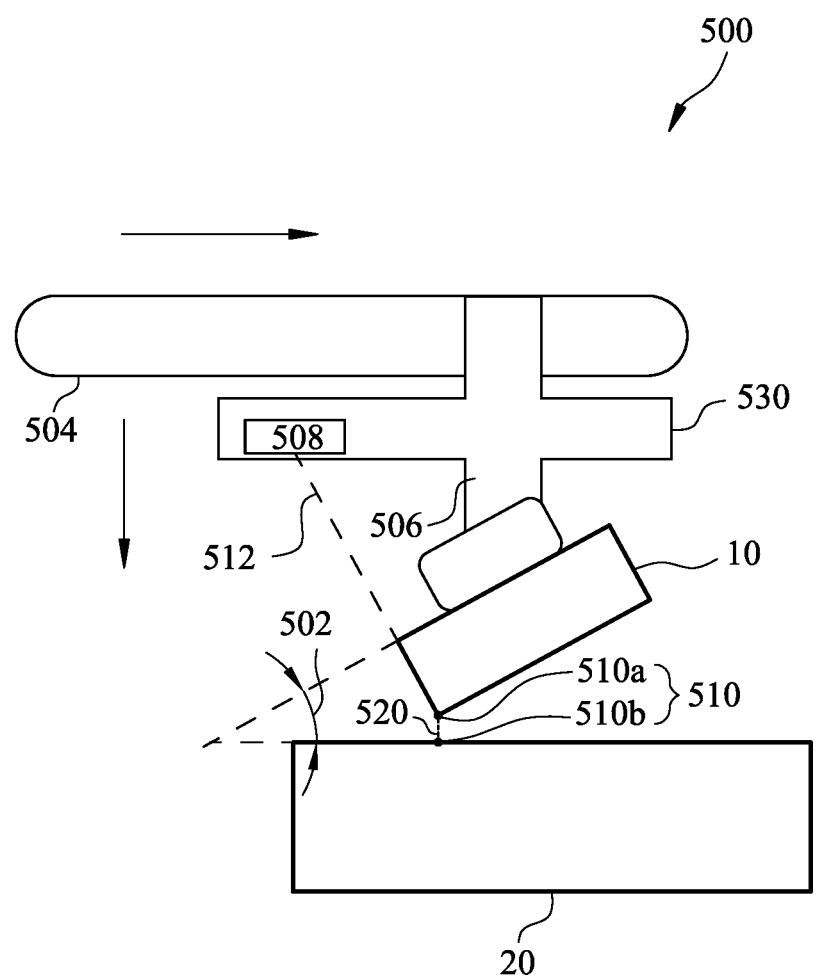

FIG. 5B illustrates a top view of the placement of semiconductor shown in FIG. 5A. In implementation, as shown here, one side of the semiconductor is tilted. In those implementation, two contacts can be monitored by placement tool 500, such as the contact 510 and contact 514. In those implementation, pick-up head 506 can be adjusted based on the location of contact 510 and the location 514. For example, the location of contact 510 can be determined by placement tool 500 simultaneously or separately with the determination of the location of the contact 514. In the case when the location of the contact 510 is determined separately from the location of contact 514, the pick-up head 506 can be corrected first based on the location of the contact 510, and can be corrected again based on the location of the contact 514.

Figure 6A:
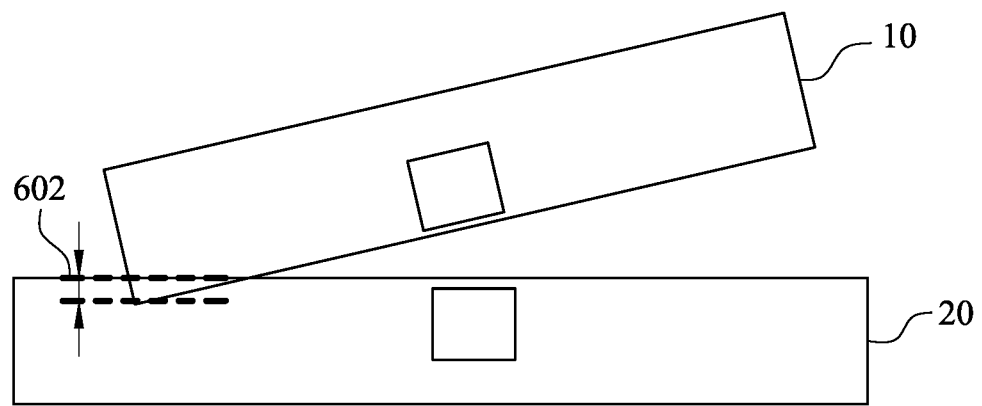
FIGS. 6A-6B are simplified cross-sectional views of indentations during placement of a semiconductor using a placement tool in accordance with the disclosure.
Figure 6B:
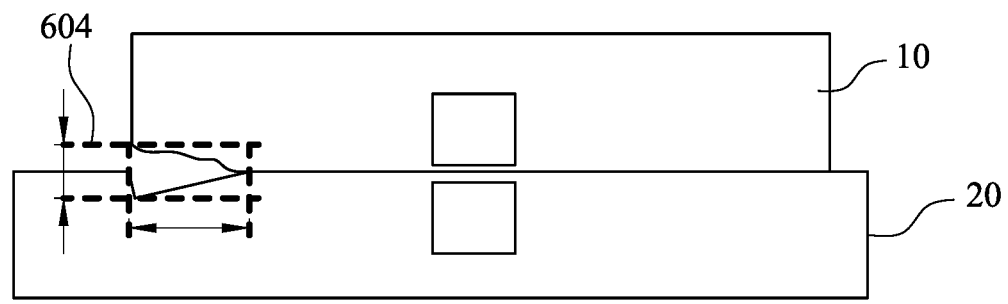

FIG. 5C illustrates that another top view of the placement of semiconductor shown in FIG. 5A. In this view, after the location(s) of one or more contacts is determined and alignment is determined by placement tool 500, the semiconductor is lowered by the pick-up head 506 onto wafer 20 at contacts 510 and 514 first. This may be referred to a one side positioning contact first. In such a placement, it is understood that an impact is made at the contacts 510 and 514 between semiconductor 10 and wafer 20. This impact may cause small deformation or cracks on semiconductor 10 and/or wafer 20. FIGS. 6A-B illustrates such a deformation.

FIG. 6A shows that when the semiconductor 10 is first made contact with the wafer 20 in accordance with the present disclosure, an indention 602 is caused due to a pressure from a weight of semiconductor 10 and/or a force from a movement of the pick-up head 506. In view of this indention, a number of considerations should be factored in when using the placement tool 500 in accordance with the present disclosure. One consideration is friction. That is when choosing contact 510 and/or 514 for placement, there should be sufficient friction between semiconductor 10 and wafer to prevent sliding. If such a friction is not present at certain parts of the semiconductor 10 and/or wafer 20, especially on an edge of semiconductor 10, those parts should be avoided to make the first contact by the pick-up head 506. Another consideration is deformation in the wafer 20 where the contact(s) are made. This deformation may cause a portion of the wafer 20 is lost (e.g. chipped away) where the contact is made. This deformation should be measured or estimated to ensure the device region on the wafer 20 is not damaged by such a deformation. In one instance, it is observed that the deformation is between 0.1-1 nm at the contact(s), and thereby the contact(s) are made at wafer 20 where it has at least 1 nm depth before the device region is damaged by the contact(s).

FIG. 6B shows that an indentation can be caused to the semiconductor 10 at the contact(s). It is observed that a void 604 may be formed at the contact(s) such that semiconductor 10 and the wafer 20 is not bonded at void 604. In implementation, the contact(s) may be selected to account for such a void. For example, if the bonded structure's performance would suffer due to such a void, contact(s) should be avoided where the void is formed. In one instance, it is observed that the void is between 0.2-2 nm in depth.

Referring back to FIG. 5D, where still another top view of placement of the semiconductor 10 shown in FIG. 5A. In this view, as can be seen, the rest of semiconductor 10 is laid flat down onto wafer 20 after the contacts 510 and 514 are made.

Figure 7A:
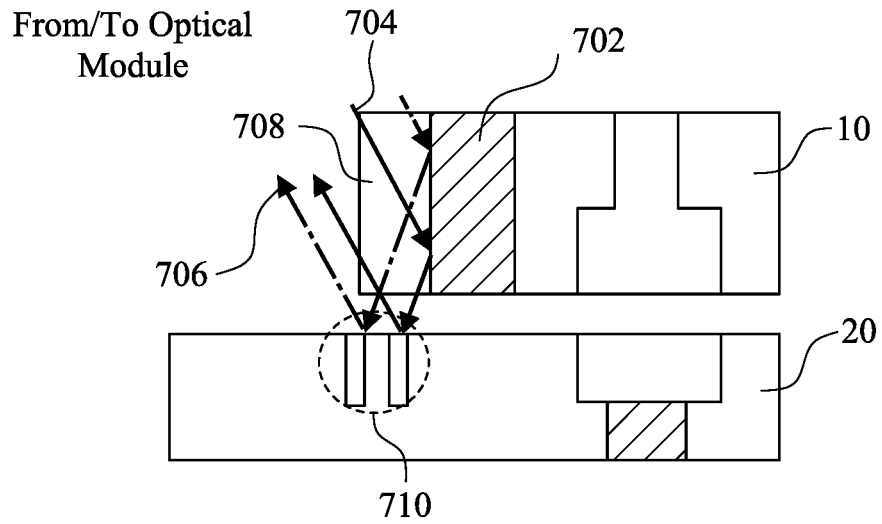
FIGS. 7A-7B illustrate embodiments for detecting contact locations using the placement tool in accordance with the present disclosure.
Figure 7B:
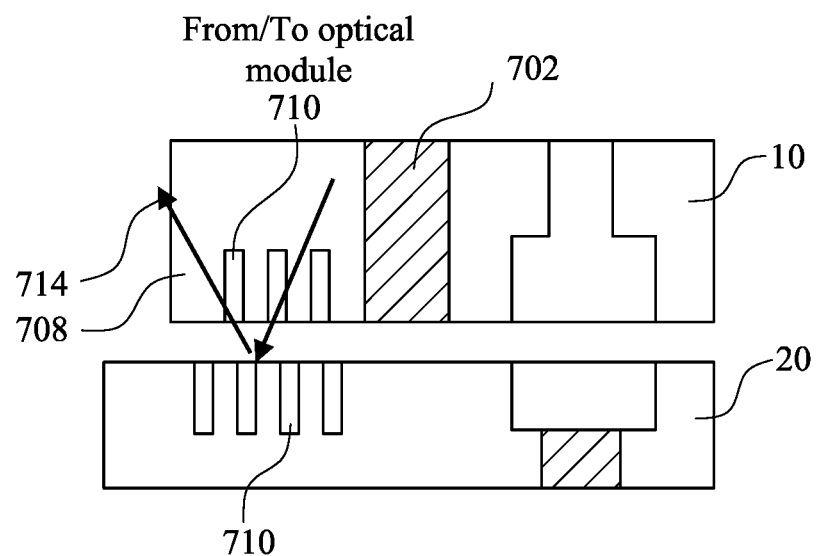

FIGS. 7A-B illustrate embodiments for detecting contact locations using the placement tool in accordance with the present disclosure. In FIG. 7A, optical beams, such as beams 704 and 706, may be emitted by a stepper motor of a placement tool in accordance with the present disclosure. The beams 704 and 706 may be emitted towards an insulation structure 702 (such as a guard ring). Because the insulation structure 702 has a lower reflection/refraction index than the dielectric layer of semiconductor 10 as shown. Because the beams 704 and 706 are bounced off insulation structure, they hit the wafer 20 at locations shown and then bounce off to be intercepted by the stepper motor again. Because a location of the insulation structure 702 in the semiconductor 10 is known, and because the angles at which the beams are emitted towards semiconductor 10 are known and the angles at which they are intercepted by the bounce off from the wafer 20 are known, the contact locations on the wafer 20 can thus be determined.

FIG. 7B illustrates that optical beam 708 may be emitted towards an alignment pattern 710 in the semiconductor 10 by the stepper motor. In this design, the optical beam 708 penetrates the semiconductor 10 and diffracts through semiconductor 10, and then bounce of corresponding alignment pattern 710 on the wafer. In this way, an interference position can be calculated by the stepper motor and an offset can be calculated to determine the contact location.

Figure 8:
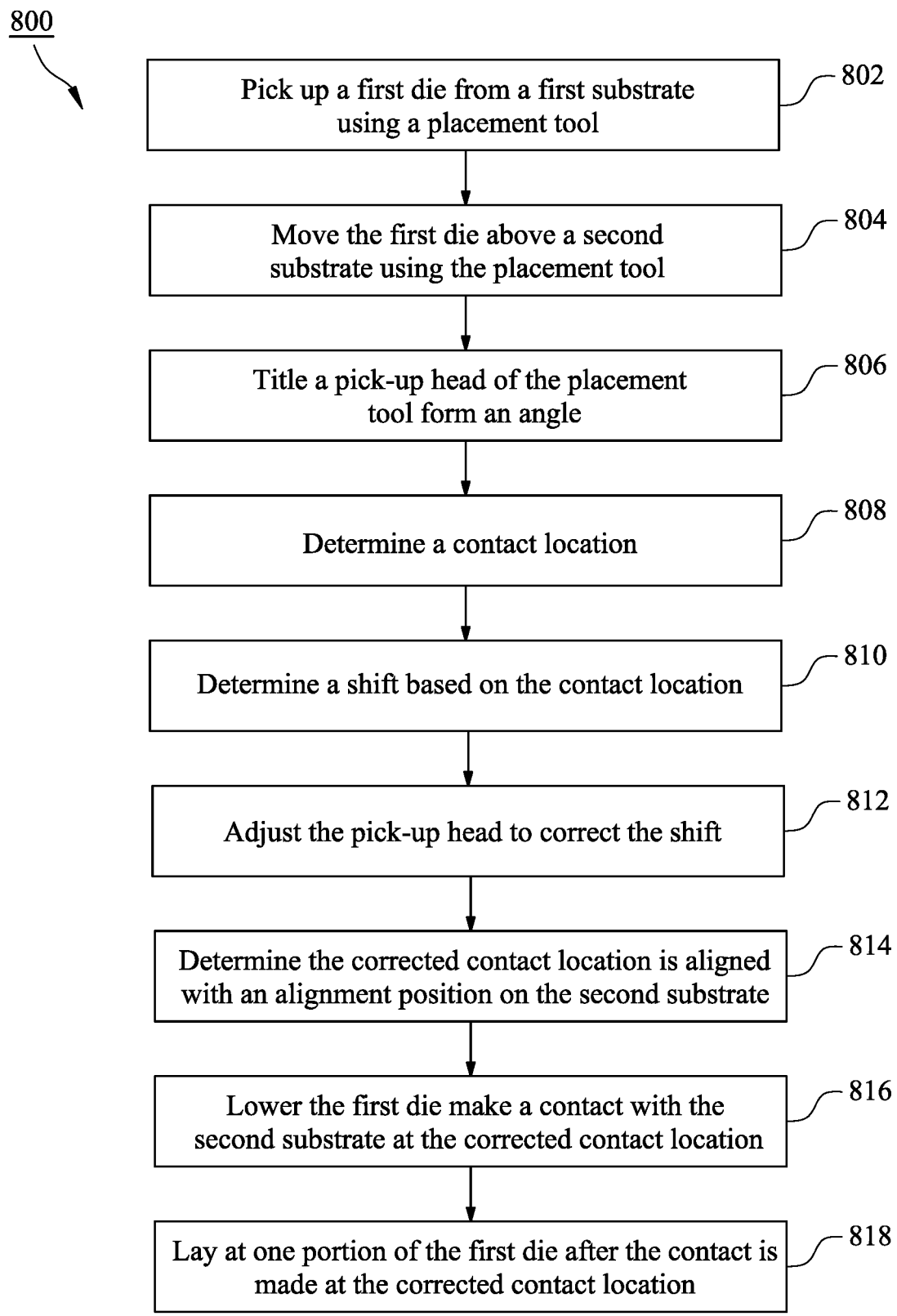
FIG. 8 illustrates an example method for forming a semiconductor package having a bonded structure in accordance with the disclosure.

FIG. 8 illustrates an example method 800 for forming a semiconductor package having a bonded structure in accordance with the disclosure. The method 800 starts at step 802. At step 802, a first die is picked up from a substrate using a placement tool. The placement tool comprises a pick-up head and a stepper motor, the pick-up head is configured to be tilt-able and the stepper motor is configured to emit one or more optical beams towards the first die. At step 804, the first die is moved by the placement tool to a first location above a substrate. At step 806, the first die is tilted by the pick-up head to form an angle between the first die and the substrate. At step 808, a contact location of the semiconductor onto the substrate is determined using the stepper motor. At step 810, a shift is determined based on the contact location. At step 812, the pick-up head is adjusted, using the stepper motor, to correct the shift-off. At step 814, it is determined, using stepper motor, that the corrected contact location is aligned with the alignment position on the substrate for the first die. At step 816, the first die is lower by the pick-up head to make a contact with the substrate at the contact location such that a least one portion of the first die does not contact the substrate. At step 818, the at least one portion of the first die is laid, using the pick-up head, onto the substrate.

In accordance with some embodiments of the disclosure, a method is provided. The method includes the following steps: picking up a first die from a substrate using a placement tool, wherein the placement tool comprises a pick-up head and a stepper motor, the pick-up head is configured to be tilt-able and the stepper motor is configured to emit one or more optical beams towards the first die; moving, using the placement tool, the first die to a first location above a substrate; lowering, using the pick-up head, the first die to a predetermined height with respect to the substrate; tilting, using the pick-up head, the first die to form an angle between the first die and the substrate; emitting, using the stepper motor, at least one optical beam towards the first die; determining, using the stepper motor, a contact location of the semiconductor onto the substrate; determining, using the stepper motor, the contact location is shift off from an alignment position on the substrate for the first die; adjusting, using the stepper motor, the pick-up head to correct the shift-off; determining, using stepper motor, the corrected contact location is aligned with the alignment position on the substrate for the first die; lowering, using the pick-up head, the first die to make a contact with the substrate at the contact location such that a least one portion of the first die does not contact the substrate; and laying, using the pick-up head, the at least one portion of the first die onto the substrate.

In accordance with some embodiments of the disclosure, a method for placing a semiconductor onto a substrate is provided. The method includes the following steps: transferring, using a placement tool, the semiconductor along a path over onto the substrate; lowering, using the placement tool, the semiconductor to a predetermined height above the substrate; titling, using the placement tool, the semiconductor, to a predetermined angle; determining, using the placement tool, a first contact point of the semiconductor to the substrate at the predetermined angle; determining, using the placement tool, the first contact point is shift-off from an alignment position on the semiconductor with respect to the substrate; adjusting, using the placement tool, the first contact point to correct the shift-off; and lowering, using the placement tool, the semiconductor to make a first contact with the substrate at the corrected first contact point.

The foregoing merely outlines features of embodiments of the disclosure. Various modifications and alternatives to the described embodiments will be apparent to those skilled in the art in view of the teachings herein. Those skilled in the art will appreciate that equivalent constructions do not depart from the scope of the present disclosure, and that they may make various changes, substitutions, and alterations herein without departing from the spirit and scope of the present disclosure.

What is claimed is:

1. A method comprising:
   picking up a first die from a substrate using a placement tool, wherein the placement tool comprises a pick-up head and a stepper motor, the pick-up head is configured to be tilt-able and the stepper motor is configured to emit one or more optical beams towards the first die;
   moving, using the placement tool, the first die to a first location above a substrate;
   lowering, using the pick-up head, the first die to a first height with respect to the substrate;
   tilting, using the pick-up head, the first die to form an angle between the first die and the substrate;
   emitting, using the stepper motor, at least one optical beam towards the first die;
   determining, using the stepper motor, a contact location of a semiconductor onto the substrate;
   determining, using the stepper motor, the contact location is displaced, by a shift-off, from an alignment position on the substrate for the first die;
   adjusting, using the stepper motor, the pick-up head to correct the shift-off,
   determining, using stepper motor, the corrected contact location is aligned with the alignment position on the substrate for the first die;
   lowering, using the pick-up head, the first die to make a contact with the substrate at the contact location such that at least one portion of the first die does not contact the substrate; and
   laying, using the pick-up head, the at least one portion of the first die onto the substrate.

2. The method of claim 1, wherein the contact location is a first contact location, and wherein the method further comprises:
   before the at least one portion of the first die is laid onto the substrate, determining, using the stepper motor, a second contact location of the first die onto the substrate;
   determining whether the second contact location is shift off from an alignment position on the substrate for the first die corresponding to the second contact location; and
   adjusting, using the stepper motor, the pick-up head to correct the shift-off of the second contact location.

3. The method of claim 1, wherein the contact location is a first contact location, and wherein the method further comprises:
   before the at least one portion of the first die is laid onto the substrate, determining, using the stepper motor, a second contact location of the semiconductor onto the substrate; and
   determining whether the second contact location is shift off from an alignment position on the substrate for the first die corresponding to the second contact location; and, wherein
   the adjustment of the pick-up head by the stepper motor is further based on the shift-off of the second contact location.

4. The method of claim 1, wherein an impact of the contact at the contact location causes a deformation of the substrate, and the substrate has a first depth greater than the deformation of the substrate.

5. The method of claim 1, wherein the stepper motor is configured to emit two optical beams towards an insulation structure in the first die at two different angles for determining the contact location.

6. The method of claim 1, wherein the stepper motor is configured to emit an optical beam towards an alignment pattern within the semiconductor.

7. The method of claim 1, wherein the substrate is a wafer.

8. The method of claim 1, wherein the substrate is part of a second semiconductor placed directly or indirectly onto a wafer.

9. The method of claim 1, wherein the placement tool is configured to:
   emit, by the stepper motor, a first optical beam;

emit, by the stepper motor, a second optical beam;
obtain a difference between a first optical path of the first optical beam and a second optical path of the second optical beam; and
determine the contact location based on the difference.

10. The method of claim 1, wherein the placement tool is configured to:
emit, by the stepper motor, an optical beam towards a first alignment pattern in the semiconductor, wherein the optical beam is bounced back by a second alignment pattern in the substrate;
calculate an interference position based on interference of the optical beam caused by the first alignment pattern and the second alignment pattern; and
determine the contact location based on the interference position.

11. A method for placing a semiconductor onto a substrate,
transferring, using a placement tool, the semiconductor along a path over onto the substrate;
lowering, using the placement tool, the semiconductor to a first height above the substrate;
titling, using the placement tool, the semiconductor, to a first angle;
determining, using the placement tool, a first contact point of the semiconductor to the substrate at the first angle, wherein the placement tool is configured to emit two optical beams towards an insulation structure in the semiconductor at two different angles for determining the contact point;
determining, using the placement tool, the first contact point is shift-off from a first alignment position on the semiconductor with respect to the substrate;
adjusting, using the placement tool, the first contact point to correct the shift-off; and
lowering, using the placement tool, the semiconductor to make a first contact with the substrate at the corrected first contact point.

12. The method of claim 11, wherein the contact point is a first contact point, and wherein the method further comprises:
before at least one portion of the semiconductor is laid onto the substrate, determining, using placement tool, a second contact point of the semiconductor onto the substrate;
determining whether the second contact point is shift off from a second alignment position on the semiconductor; and
adjusting, using the placement tool, the second contact point by correcting the shift-off of the second contact point.

13. The method of claim 11, wherein contact point is a first contact point, and wherein the method further comprises:
before at least one portion of the semiconductor is laid onto the substrate, determining, placement tool, a second contact point of the semiconductor onto the substrate; and
determining whether the second contact point is shift off from a second alignment position on the semiconductor; and, wherein
the adjustment of the first contact point is further based on the shift-off of the second contact point.

14. The method of claim 11, wherein an impact of the contact at the contact location causes a deformation of the substrate, and the substrate has a first depth greater than the deformation of the substrate.

15. The method of claim 11, wherein the substrate is a wafer.

16. The method of claim 11, wherein the substrate is part of a second semiconductor placed directly or indirectly onto a wafer.

17. The method of claim 11, wherein the placement tool is configured to:
emit, by a stepper motor of the placement tool, a first optical beam;
emit, by the stepper motor, a second optical beam;
obtaining a difference between a first optical path of the first optical beam and a second optical path of the second optical beam; and
determining the contact location based on the difference.

18. The method of claim 11, wherein the placement tool is configured to:
emit, by a stepper motor of the placement tool, an optical beam towards a first alignment pattern in the semiconductor, wherein the optical beam is bounced back by a second alignment pattern in the substrate;
calculate an interference position based on interference of the optical beam caused by the first alignment pattern and the second alignment pattern; and
determine the contact location based on the interference position.

19. The method of claim 14, wherein the first depth is greater than 1 nm.

20. A method for placing a semiconductor onto a substrate,
transferring, using a placement tool, the semiconductor along a path over onto the substrate;
lowering, using the placement tool, the semiconductor to a first height above the substrate;
titling, using the placement tool, the semiconductor, to a first angle;
determining, using the placement tool, a first contact point of the semiconductor to the substrate at the first angle, wherein the placement tool is configured to emit an optical beam towards an alignment pattern within the semiconductor;
determining, using the placement tool, the first contact point is shift-off from a first alignment position on the semiconductor with respect to the substrate;
adjusting, using the placement tool, the first contact point to correct the shift-off; and
lowering, using the placement tool, the semiconductor to make a first contact with the substrate at the corrected first contact point.

* * * * *